(12) United States Patent
Kim et al.

(10) Patent No.: US 8,653,637 B2
(45) Date of Patent: Feb. 18, 2014

(54) STACK TYPE SEMICONDUCTOR PACKAGE APPARATUS

(75) Inventors: Kyung-man Kim, Hwaseong-si (KR); In-sang Song, Seoul (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 836 days.

(21) Appl. No.: 12/700,884

(22) Filed: Feb. 5, 2010

(65) Prior Publication Data
US 2010/0237485 A1 Sep. 23, 2010

(30) Foreign Application Priority Data
Mar. 17, 2009 (KR) .................. 10-2009-0022748

(51) Int. Cl.
*H01L 25/11* (2006.01)

(52) U.S. Cl.
USPC .............. 257/686; 257/692; 257/E25.027; 438/107

(58) Field of Classification Search
USPC ............. 257/686, 692, E25.027; 438/107
See application file for complete search history.

(56) References Cited

U.S. PATENT DOCUMENTS

| 5,498,902 | A | * | 3/1996 | Hara | 257/686 |
| 6,607,937 | B1 | * | 8/2003 | Corisis | 438/108 |
| 6,778,406 | B2 | * | 8/2004 | Eldridge et al. | 361/776 |
| 7,714,416 | B2 | * | 5/2010 | Bauer et al. | 257/666 |
| 7,723,159 | B2 | * | 5/2010 | Do et al. | 438/113 |
| 2005/0133571 | A1 | * | 6/2005 | Chuang | 228/180.5 |
| 2008/0029858 | A1 | | 2/2008 | Merilo et al. | |
| 2008/0054437 | A1 | * | 3/2008 | Hwang | 257/686 |
| 2008/0157328 | A1 | * | 7/2008 | Kawata | 257/686 |
| 2009/0236735 | A1 | * | 9/2009 | Corisis et al. | 257/723 |
| 2009/0309206 | A1 | * | 12/2009 | Kim et al. | 257/686 |

FOREIGN PATENT DOCUMENTS

JP 2007-324294 12/2007
KR 1020000027876 5/2000

* cited by examiner

*Primary Examiner* — N Drew Richards
*Assistant Examiner* — John P Dulka
(74) *Attorney, Agent, or Firm* — F. Chau & Associates, LLC

(57) ABSTRACT

A semiconductor device includes a first semiconductor package having at least one first semiconductor chip and a first sealing member covering the at least one first semiconductor chip. The semiconductor device also includes a second semiconductor package stacked on the first semiconductor package. The second semiconductor package has at least one second semiconductor chip, leads electrically connected to the at least one second semiconductor chip, and a second sealing member covering the at least one second semiconductor chip. At least one signal connection member is disposed in the first sealing member of the first semiconductor package. The at least one signal connection member electrically connects the at least one first semiconductor chip with the leads of the at least one second semiconductor chip.

15 Claims, 7 Drawing Sheets

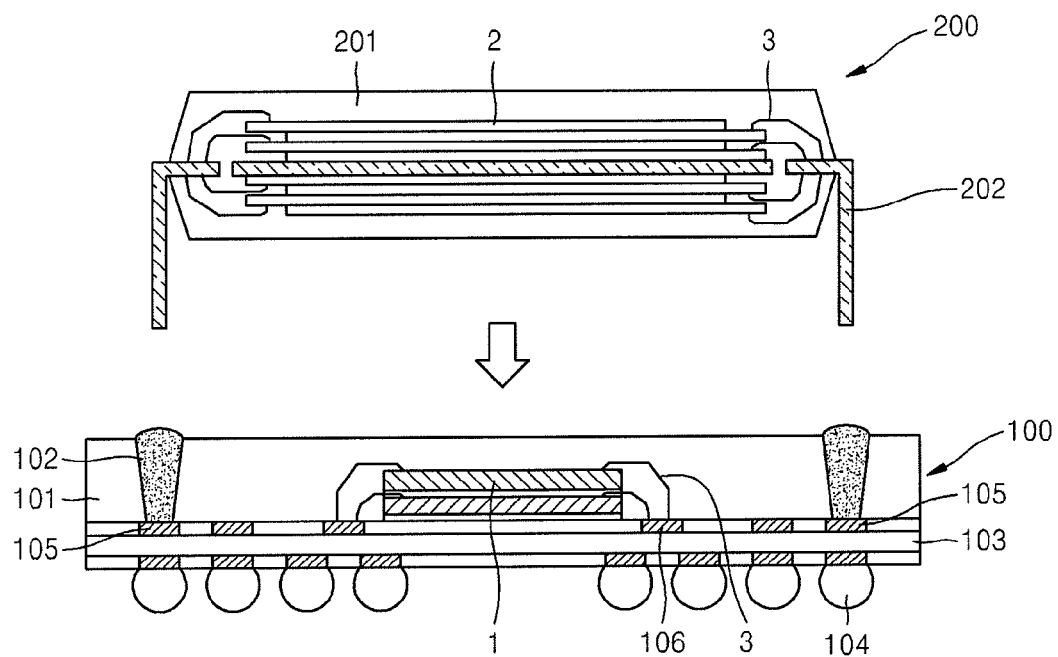
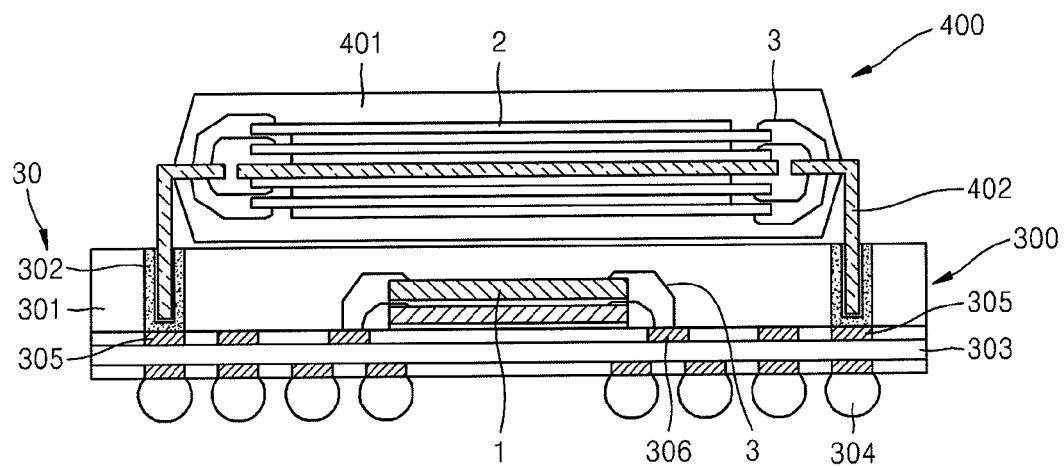

STACK TYPE SEMICONDUCTOR PACKAGE APPARATUS

CROSS-REFERENCE TO RELATED APPLICATION

This application claims priority to Korean Patent Application No. 10-2009-0022748, filed on Mar. 17, 2009, the disclosure of which is incorporated herein by reference in its entirety.

BACKGROUND

1. Technical Field

The present disclosure relates to a stack type semiconductor package apparatus, and more particularly, to a stack type semiconductor package apparatus having a signal connection member.

2. Discussion of Related Art

Package on Package (PoP) is an integrated circuit packaging technique to allow vertically combining discrete logic and memory ball grid array (BGA) packages. In PoP, semiconductor packages having various functions are stacked in a multi-layer structure. PoP may include a solder joint to electrically connect the semiconductor packages.

In PoP, an upper surface and a lower surface of respective semiconductor packages may have different thermal expansion coefficients. Thus, when a temperature deviation caused by, for example, a high temperature, occurs to PoP, a semiconductor substrate of the PoP can be deformed. Then, an outer wall or a center part of the PoP becomes irregular due to the deformation of the semiconductor substrate. As a result, a defect of a solder joint disposed between semiconductor packages in a PoP may occur.

SUMMARY OF THE INVENTION

According to an exemplary embodiment, a semiconductor device comprises a first semiconductor package having at least one first semiconductor chip and a first sealing member covering the at least one first semiconductor chip, a second semiconductor package stacked on the first semiconductor package, the second semiconductor package having at least one second semiconductor chip, leads electrically connected to the at least one second semiconductor chip, and a second sealing member covering the at least one second semiconductor chip, and at least one signal connection member disposed in the first sealing member of the first semiconductor package, the at least one signal connection member electrically connecting the at least one first semiconductor chip with the leads of the at least one second semiconductor chip.

The first semiconductor package may further comprise a circuit board receiving the at least one first semiconductor chip on a first surface of the circuit board, and the circuit board comprises joining pads formed thereon to receive the at least one signal connection member.

The circuit board may further comprise solder balls formed on a second surface, wherein the first surface and the second surface are substantially parallel with respect to a major axis of the circuit board.

The at least one signal connection member can be vias formed through the first sealing member and formed on the joining pads.

The vias may comprise via holes, and conductive paste can be filled in the via holes.

Front end parts of the leads may contact with the vias.

The circuit board may comprise wire connection pads connected to wires of the at least one first semiconductor chip.

The at least one signal connection member can be a socket formed in the first sealing member and formed on each of the joining pads to receive a first end of each of the leads.

The first semiconductor package may further comprise a redistribution layer formed on the at least one first semiconductor chip, and the redistribution layer may comprise joining pads formed thereon to receive the at least one signal connection member.

The at least one signal connection member can be a via disposed in the first sealing member and can be formed on each of the joining pads.

The at least one signal connection member can be a socket disposed in the first sealing member and can be formed on each of the joining pads to receive a first end of each of the leads.

The socket may include a round space receiving a round-shaped first end of each of the leads.

According to an exemplary embodiment of the present invention, a method of forming a semiconductor device comprises forming a first semiconductor chip on a first portion of a circuit board disposed in a first semiconductor package, forming joining pads on a second portion of the circuit board, forming a first sealing member on the first semiconductor chip and the joining pads, removing a portion of the first sealing member to expose the joining pads, filling the removed portion of the first sealing member with a conductive material, stacking a second semiconductor package having a lead on the first semiconductor package, wherein a first end of the lead is disposed in the second semiconductor package and a second end of the lead extends outwardly beyond the second semiconductor package, and inserting the second end of the lead into the conductive material of the first semiconductor package.

Removing the portion of the first sealing member may include at least one of a laser perforation method, a perforation by molding method, a perforation by drilling method, or an etching perforation method using gas or chemicals.

Inserting the second end of the lead into the conductive material may comprise a reflow process at high temperature.

The conductive material may comprise a socket, and a method of inserting the second end of the lead into the conductive material may comprise inserting the second end into the socket.

According to an exemplary embodiment of the present invention, a method of forming a semiconductor device comprises forming a first semiconductor chip on a circuit board disposed in a first semiconductor package, forming a redistribution layer on a top surface of the first semiconductor chip, forming a joining pad on the redistribution layer, forming a first sealing member on the first semiconductor chip, the redistribution layer, and the joining pad, removing a portion of the first sealing member to expose the joining pad, filling the removed portion of the first sealing member with a conductive material, stacking a second semiconductor package having a lead on the first semiconductor package, wherein a first end of the lead is disposed in the second semiconductor package and a second end of the lead extends outwardly beyond the second semiconductor package, and inserting the second end of the lead into the conductive material of the first semiconductor package.

Removing the portion of the first sealing member may include at least one of a laser perforation method, a perforation by molding method, a perforation by drilling method, or an etching perforation method using gas or chemicals.

Inserting the second end of the lead into the conductive material may comprise a reflow process at high temperature.

The conductive material may comprise a socket, and a method of inserting the second end of the lead into the conductive material may comprise inserting the second end into the socket.

BRIEF DESCRIPTION OF THE DRAWINGS

Exemplary embodiments of the present invention will be more clearly understood from the following detailed description taken in conjunction with the accompanying drawings in which:

FIGS. 2 through 5 are cross-sectional views illustrating a method of manufacturing a stack type semiconductor package apparatus according to an exemplary embodiment of the present invention;

FIG. 6 is a cross-sectional view illustrating a stack type semiconductor package apparatus according to an exemplary embodiment of the present invention;

DETAILED DESCRIPTION OF EXEMPLARY EMBODIMENTS

The present invention will now be described more fully with reference to the accompanying drawings in which example embodiments of the invention are shown. This invention may, however, be embodied in many different forms and should not be construed as limited to the exemplary embodiments set forth herein.

Figure 1:
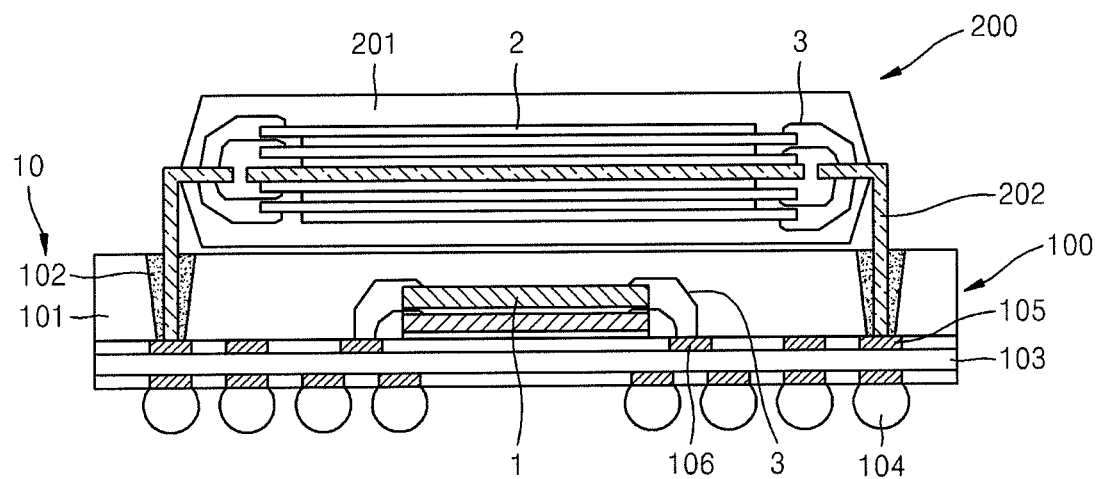
FIG. 1 is a cross-sectional view of a stack type semiconductor package apparatus according to an exemplary embodiment of the present invention.

FIG. 1 is a cross-sectional view of a stack type semiconductor package apparatus according to an exemplary embodiment of the present invention. FIGS. 2 through 5 are cross-sectional views illustrating a method of manufacturing a stack type semiconductor package apparatus according to an exemplary embodiment of the present invention.

Referring to FIG. 1, the stack type semiconductor package apparatus according to an exemplary embodiment includes a first semiconductor package 100, a second semiconductor package 200 stacked on the first semiconductor package 100, and signal connection members 10.

The first semiconductor package 100 includes first semiconductor chips 1 stacked in a multi-layer, a first sealing member 101 protecting the first semiconductor chips 1, and a circuit board 103 where the first semiconductor chips 1 are disposed.

The first semiconductor chips 1 are electrically connected to the circuit board 103 through, for example, wires 3. In exemplary embodiments, various other signal transmission members are used to electrically connect the first semiconductor chips 1 with the circuit board 103.

Joining pads 105 and wire connection pads 106 are formed on the circuit board 103. The wire connection pads 106 are connected to the wires 3 extended from the first semiconductor chips 1. Solder balls 104 may be formed on the lower surface of the circuit board 103.

Referring to FIG. 1, the second semiconductor package 200 includes second semiconductor chips 2, leads 202 electrically connected to the second semiconductor chips 2, a second sealing member 201 covering the second semiconductor chips 2.

The second semiconductor chips 2 are electrically connected to each other through the leads 202 and the wires 3. In exemplary embodiments, various other signal transmission members are used to electrically connect the second semiconductor chips 2 to each other.

The signal connection members 10 are disposed in the first sealing member 101 of the first semiconductor package 100 to connect the first semiconductor chips 1 with the leads 202 of the second semiconductor chips 2 so that the second semiconductor package 200 may be stacked on the first semiconductor package 100. In exemplary embodiments, various forms of signal connection members may be applied. For example, as illustrated in FIG. 1, vias 102, which penetrate the first sealing member 101 and are formed on the joining pads 105, may be applied.

Figure 2:
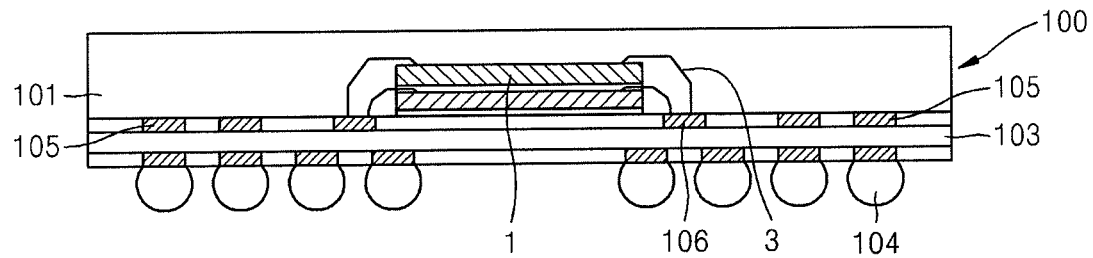
Figure 3:
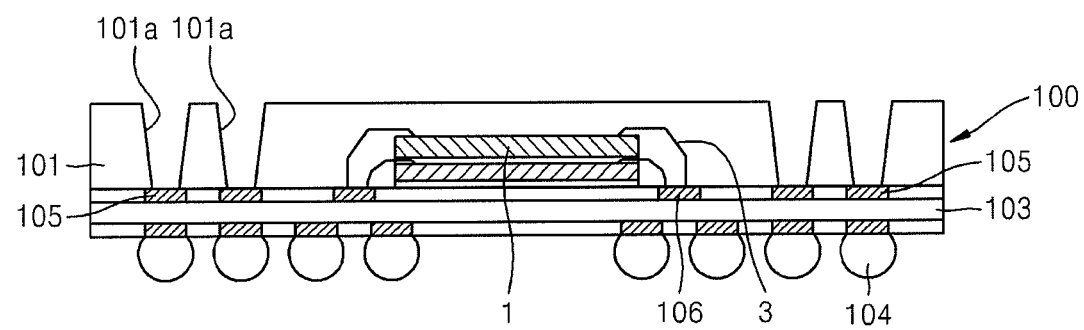

A method of manufacturing the vias 102 is described with reference to FIGS. 2 through 5. Referring to FIG. 2, the first semiconductor package 100 is prepared. Referring to FIG. 3, via holes 101a can be formed through the first sealing member 101 using, for example, a laser perforation method, a perforation by molding method, a perforation by drilling method, or an etching perforation method using gas or chemicals.

The via holes 101a are positioned above the previously formed joining pads 105 so that the joining pads 105 are exposed before the via holes 101a are filled with a conductive material.

Figure 4:
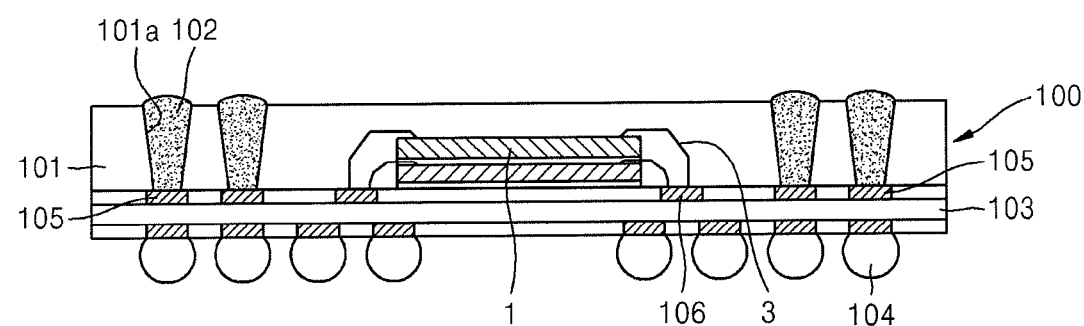

Referring to FIG. 4, conductive paste is filled in the via holes 101a. Referring to FIG. 5, front end parts of the leads 202 contact the vias 102 by, for example, a reflow process at high temperature. The front end parts of the leads 202 are substantially inserted into the vias 102. In an exemplary embodiment, the front end parts of the leads 202 contact the joining pads 105. As such, the second semiconductor package 200 is stacked on the first semiconductor package 100.

FIG. 6 is a cross-sectional view illustrating a stack type semiconductor package apparatus including first and second semiconductor packages 300, 400, according to an exemplary embodiment of the present invention.

Referring to FIG. 6, sockets 302 are used as signal connection members 30.

The sockets 302 are formed on joining pads 305 by penetrating a first sealing member 301 and correspond to leads 402 so that the sockets 302 are forcibly engaged with the leads 402. The shape of the leads 402 may vary according to exemplary embodiments of the present invention. For example, the leads 402 can be stick type leads. Similar to the embodiment described in connection with FIG. 1, the semiconductor package apparatus of FIG. 6 includes a circuit board 303, solder balls 304 and wire connection pads 306.

Figure 7:
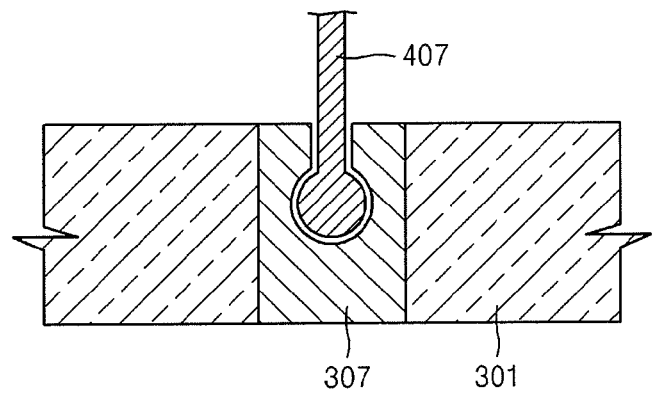
FIG. 7 is an enlarged cross-sectional view illustrating a signal connection member according to an exemplary embodiment of the present invention.

FIG. 7 is an enlarged cross-sectional view illustrating signal connection members according to an exemplary embodiment of the present invention.

Referring to FIG. 7, a front end part of a lead 407 may be round in correspondence with the shape of a round hole formed in a socket 307 so that the lead 407 is forcibly engaged with the round hole formed in the socket 307.

The stack type semiconductor package apparatus described above with reference to FIGS. 1 through 5 has a fan-out type package on package (POP) structure in which the signal connection members 10 are expanded to the outside beyond the size of the first semiconductor chips 1.

In an exemplary embodiment, the stack type semiconductor package apparatus may have a fan-in type POP structure in which a signal connection member is disposed within first semiconductor chips.

Figure 8:
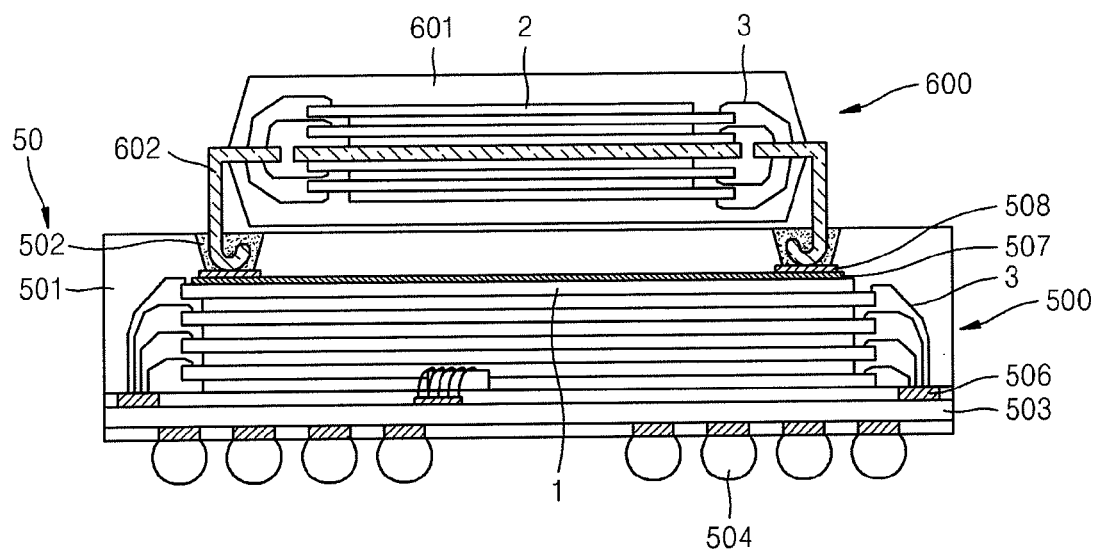
FIG. 8 is a cross-sectional view of a stack type semiconductor package apparatus according to an exemplary embodiment of the present invention.

FIG. 8 is a cross-sectional view of a stack type semiconductor package apparatus according to an exemplary embodiment of the present invention. FIGS. 9 through 12 are cross-sectional views illustrating a method of manufacturing a stack type semiconductor package apparatus according to an exemplary embodiment of the present invention.

Referring to FIG. 8, a first semiconductor package 500 includes a redistribution layer 507 formed on the first semiconductor chips 1, wherein the redistribution layer 507 includes joining pads 508 formed thereon to connect to signal connection members 50.

As the signal connection members 50, vias 502 are used. Vias 502 are formed through a first sealing member 501. The vias 502 are formed on the joining pads 508. In an exemplary embodiment, as illustrated in FIG. 6, the sockets 302 may be used as the signal connection members 50. Referring to FIG. 6, the sockets 302 are formed on the joining pads 305 by penetrating the first sealing member 301 and correspond to the front end parts of the leads 402, thereby being forcibly engaged with the leads 402. Similar to the embodiment described in connection with FIG. 1 the semiconductor package apparatus of FIG. 8 includes a circuit board 503, solder balls 504, wire connection pads 506, and a second sealing member 601.

Figure 9:
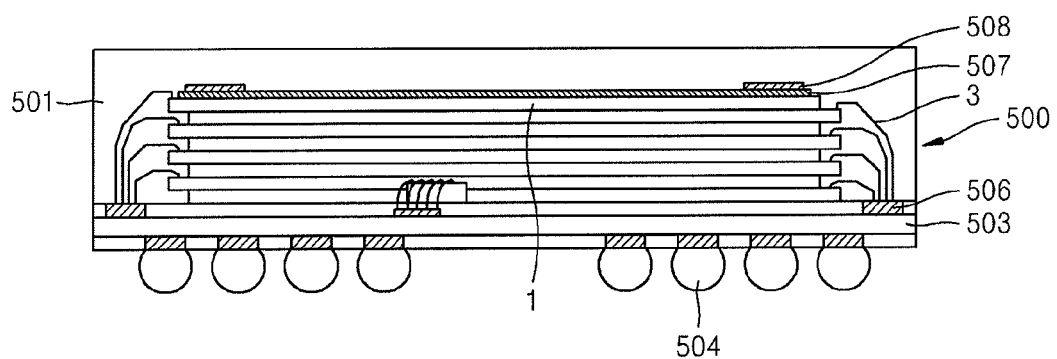
FIGS. 9 through 12 are cross-sectional views illustrating a method of manufacturing a stack type semiconductor package apparatus according to an exemplary embodiment of the present invention.
Figure 10:
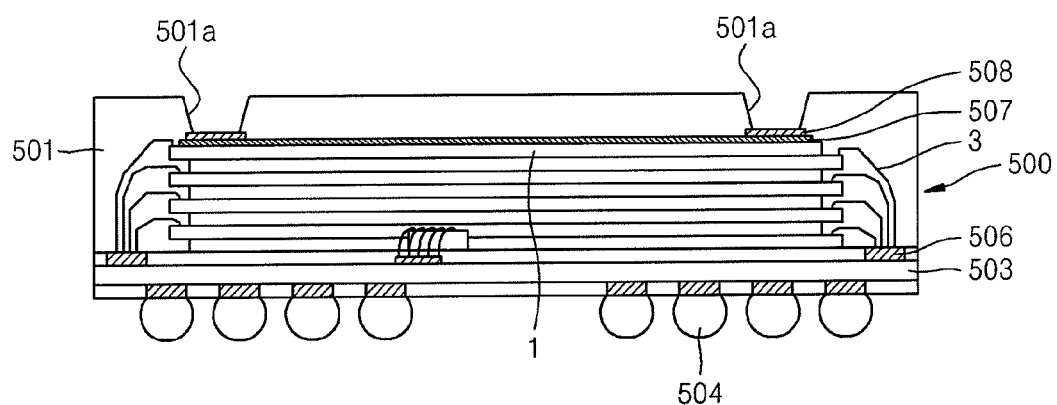

A method of manufacturing the vias 502 is described with reference to FIGS. 9 through 12. Referring to FIG. 9, the first semiconductor package 500 including the redistribution layer 507 and the joining pads 508 are prepared. Referring to FIG. 10, via holes 501a are formed through the first sealing member 501 using, for example, a laser perforation method, a perforation by molding method, a perforation by drilling method, or an etching perforation method using gas or chemicals.

The via holes 501a are positioned above the previously formed joining pads 508 so that the joining pads 508 are exposed before the via holes 501a are filled with a conductive material in a subsequent process.

Figure 11:
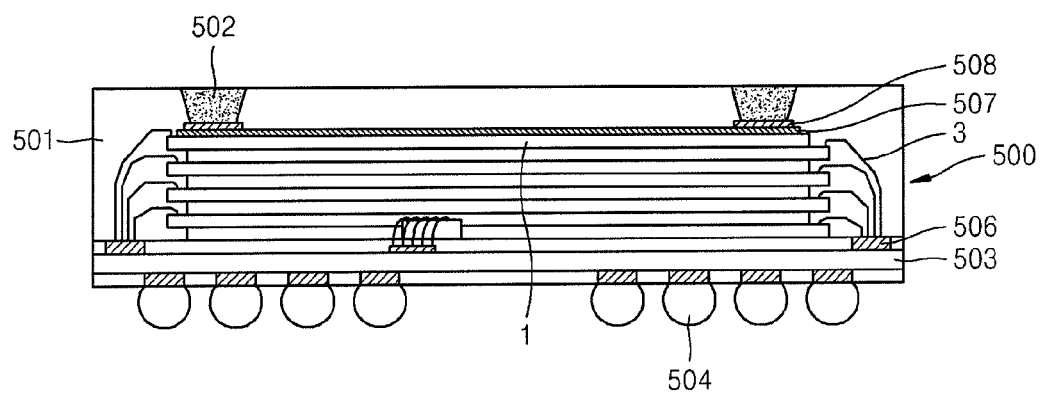
Figure 12:
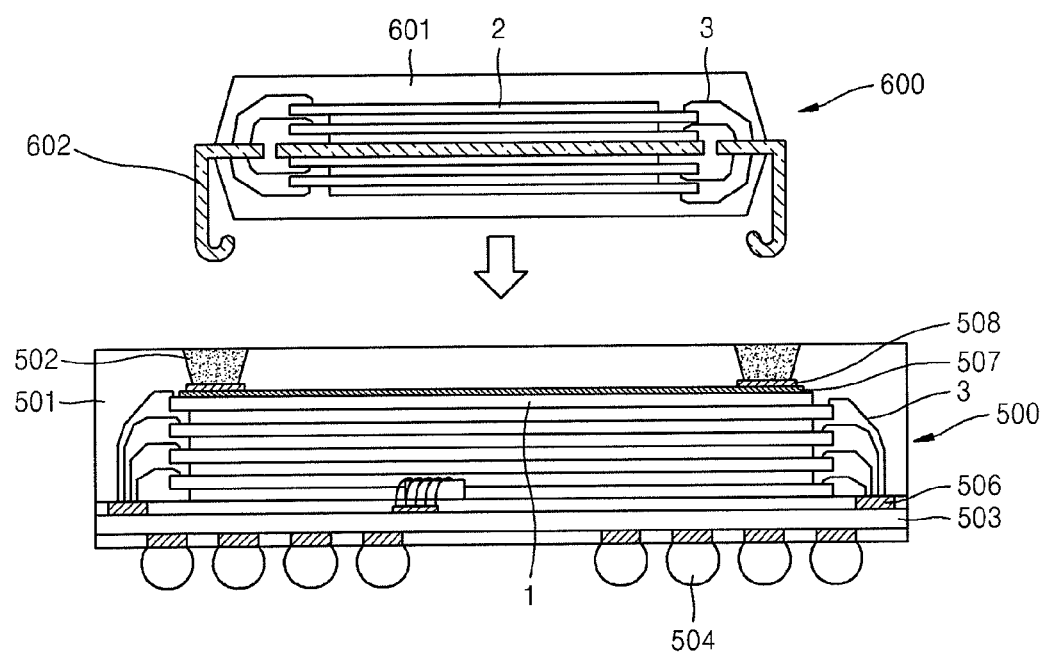

Referring to FIG. 11, conductive paste is filled in the via holes 501a. Referring to FIG. 12, front end parts of leads 602 of a second semiconductor package 600 contact and are received by the vias 502 by, for example, a reflow process at high temperature. In an exemplary embodiment, the front end parts of leads 602 contact joining pads 508.

Figure 13:
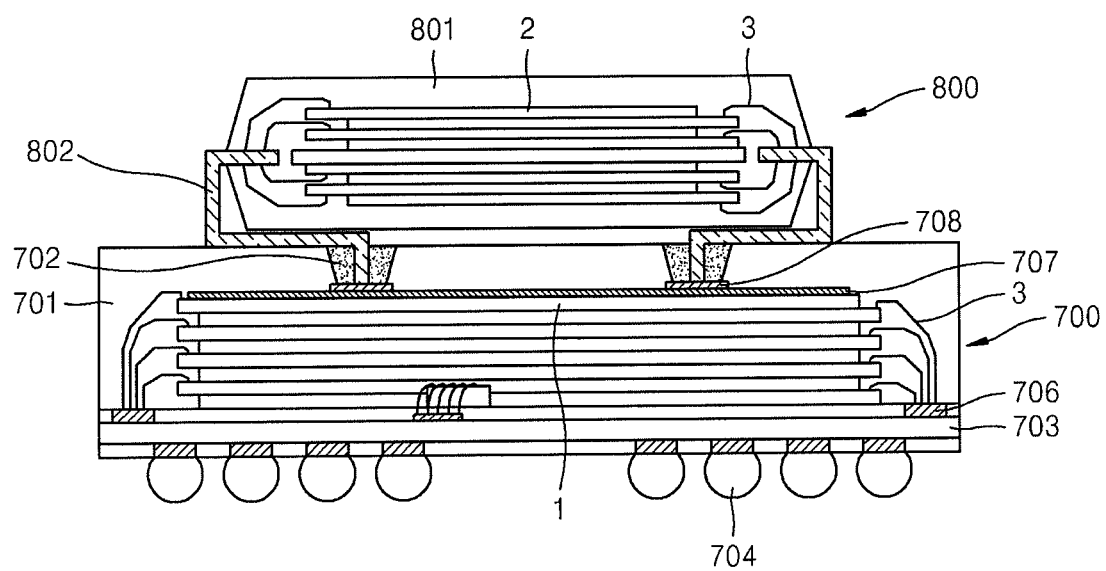
FIG. 13 is a cross-sectional view of a stack type semiconductor package apparatus according to an exemplary embodiment of the present invention.

FIG. 13 is a cross-sectional view of a stack type semiconductor package apparatus according to an exemplary embodiment of the present invention.

Referring to FIG. 13, leads 802 are bent several times and are extended to connect to a center portion of joining pads 708 on a redistribution layer 707. In exemplary embodiments, various shapes of leads can be formed to electrically connect the first semiconductor package 700 with the second semiconductor package 800. Similar to the embodiment described in connection wit FIG. 8, the semiconductor package apparatus of FIG. 13 includes first and second sealing members 701, 801 vias 702 formed in the first sealing member 701, a circuit board 703, solder balls 704, and wire connection pads 706.

According to exemplary embodiments of the present invention, a defect of a solder joint occurring due to deformation of a substrate generated according to temperature deviation while stacking semiconductor packages can be prevented.

According to exemplary embodiments of the present invention, a stack type semiconductor package apparatus includes signal connection members disposed between semiconductor packages.

According to exemplary embodiments of the present invention, a joining pad is disposed on a circuit board and thus conductivity thereof is improved, and a socket is applied thereto and thus the semiconductor packages are easily coupled and detached from each other.

Although the exemplary embodiments of the present invention have been described herein with reference to the accompanying drawings, it is to be understood that the present invention should not be limited to those precise embodiments and that various other changes and modifications may be affected therein by one of ordinary skill in the related art without departing from the scope or spirit of the invention. All such changes and modifications are intended to be included within the scope of the invention as defined by the appended claims.

What is claimed is:

1. A semiconductor device comprising:
   a first semiconductor package having at least one first semiconductor chip and a first sealing member covering the at least one first semiconductor chip;
   a second semiconductor package stacked on the first semiconductor package, the second semiconductor package having at least one second semiconductor chip, leads electrically connected to the at least one second semiconductor chip, and a second sealing member covering the at least one second semiconductor chip; and
   at least one signal connection member disposed in the first sealing member of the first semiconductor package, the at least one signal connection member electrically connecting the at least one first semiconductor chip with the leads,
   wherein the first semiconductor package further comprises a circuit board receiving the at least one first semiconductor chip on a first surface of the circuit board, and the circuit board comprises joining pads directly formed thereon to receive the at least one signal connection member, and
   the at least one signal connection member includes vias formed through the first sealing member and formed on the joining pads.

2. The semiconductor device of claim 1, wherein the circuit board comprises solder balls formed on a second surface, wherein the first surface and the second surface are substantially parallel with respect to a major axis of the circuit board.

3. The semiconductor device of claim 1, wherein the vias comprise via holes, and conductive paste is filled in the via holes.

4. The semiconductor device of claim 3, wherein front end parts of the leads contact the vias.

5. The semiconductor device of claim 1, wherein the circuit board comprises wire connection pads connected to wires of the at least one first semiconductor chip.

6. The semiconductor device of claim 1, wherein the at least one signal connection member includes a socket formed in the first sealing member and formed on each of the joining pads to receive a first end of each of the leads.

7. A method of forming a semiconductor device comprising:
- forming a first semiconductor chip on a first portion of a circuit board disposed in a first semiconductor package;
- forming joining pads on a second portion of the circuit board, wherein the joining pads are directly formed on the circuit board;
- forming a first sealing member on the first semiconductor chip and the joining pads;
- removing a portion of the first sealing member to expose the joining pads;
- filling the removed portion of the first sealing member with a conductive material;
- stacking a second semiconductor package having a lead on the first semiconductor package, wherein a first end of the lead is disposed in the second semiconductor package and a second end of the lead extends beyond the second semiconductor package; and
- inserting the second end of the lead into the conductive material of the first semiconductor package.

8. The method of claim 7, wherein the removing the portion of the first sealing member includes at least one of a laser perforation method, a perforation by molding method, a perforation by drilling method, or an etching perforation method using gas or chemicals.

9. The method of claim 7, wherein the inserting the second end of the lead into the conductive material comprises a reflow process.

10. The method of claim 7, wherein the conductive material comprises a socket, and the inserting the second end of the lead into the conductive material comprises inserting the second end into the socket.

11. A method of forming a semiconductor device comprising:
- forming a first semiconductor chip on a circuit board disposed in a first semiconductor package;
- forming a redistribution layer on a top surface of the first semiconductor chip;
- forming a joining pad on the redistribution layer;
- forming a first sealing member on the first semiconductor chip, the redistribution layer, and the joining pad;
- removing a portion of the first sealing member to expose the joining pad;
- filling the removed portion of the first sealing member with a conductive material;
- stacking a second semiconductor package having a lead on the first semiconductor package, wherein a first end of the lead is disposed in the second semiconductor package and a second end of the lead extends outwardly beyond the second semiconductor package; and inserting the second end of the lead into the conductive material of the first semiconductor package, wherein the second semiconductor package includes a bottom side opposing a top side of the first semiconductor package, and left and right sides extending from the bottom side, wherein the lead extends out of the second semiconductor package from at least one of the left and right sides, and includes at least one bend angling the second end of the lead toward the top side of the first semicondudor package; and
- inserting the second end of the lead into the conductive material of the first semiconductor package.

12. The method of claim 11, wherein the removing the portion of the first sealing member includes at least one of a laser perforation method, a perforation by molding method, a perforation by drilling method, or an etching perforation method using gas or chemicals.

13. The method of claim 11, wherein the inserting the second end of the lead into the conductive material comprises a reflow process.

14. The method of claim 11, wherein the conductive material comprises a socket, and the inserting the second end of the lead into the conductive material comprises inserting the second end into the socket.

15. A method of forming a semiconductor device comprising:
- forming a first semiconductor chip on a first portion of a circuit board disposed in a first semiconductor package;
- forming joining pads on a second portion of the circuit board, wherein the second portion is different from the first portion;
- forming a first sealing member on the first semiconductor chip and the joining pads;
- removing a portion of the first sealing member to expose the joining pads;
- filling the removed portion of the first sealing member with a conductive material;
- stacking a second semiconductor package having a lead on the first semiconductor package, wherein a first end of the lead is disposed in the second semiconductor package and a second end of the lead extends beyond the second semiconductor package; and
- inserting the second end of the lead into the conductive material of the first semiconductor package.

* * * * *